United States Patent [19]

Yung et al.

[11] Patent Number: 5,091,662
[45] Date of Patent: Feb. 25, 1992

[54] HIGH-SPEED LOW-POWER SUPPLY-INDEPENDENT TTL COMPATIBLE INPUT BUFFER

[75] Inventors: Henry T-H Yung; William R. Krenik, both of Dallas, Tex.

[73] Assignee: Texas Instruments Incorporated, Dallas, Tex.

[21] Appl. No.: 657,984

[22] Filed: Feb. 21, 1991

Related U.S. Application Data

[63] Continuation of Ser. No. 355,939, May 23, 1989, abandoned.

[51] Int. Cl.⁵ .......................... H03K 19/0175
[52] U.S. Cl. ........................ 307/475; 307/451
[58] Field of Search .............. 307/264, 296.7, 296.8, 307/443, 451, 475

[56] References Cited

U.S. PATENT DOCUMENTS

| | | | |
|---|---|---|---|
| 4,716,320 | 12/1987 | McAdams | 307/443 |
| 4,734,592 | 3/1988 | Essig et al. | 307/443 |
| 4,752,703 | 6/1988 | Lin | 307/443 |
| 4,804,871 | 2/1989 | Walters, Jr. | 307/443 |
| 4,825,110 | 4/1989 | Yamaguchi et al. | 307/443 |
| 4,885,479 | 12/1989 | Oritani | 307/475 |
| 4,897,560 | 1/1990 | Saito et al. | 307/443 |
| 4,904,884 | 2/1990 | O'Shaughnessy et al. | 307/451 |

Primary Examiner—Stanley D. Miller
Assistant Examiner—Terry D. Cunningham
Attorney, Agent, or Firm—B. Peter Barndt; James T. Comfort; Melvin Sharp

[57] ABSTRACT

A TTL compatible CMOS high-speed lower-power supply-independent input buffer has a first current mirror which supplies current to a reference node of the input buffer when the signal at the input node of the buffer goes to a high state. An MOS transistor has its gate connected to the input node and switches hard on when the input node goes to a high level, pulling the reference node to a low level. A second current mirror is provided which injects current into the reference node for a predetermined period of time after the voltage level at the input of the buffer goes to a low level to pull the reference node to a high level. Both the first and second current mirror are switched on only during transition states of the input buffer, to minimize power dissipation when the input buffer is in its quiescent state.

24 Claims, 2 Drawing Sheets

HIGH-SPEED LOW-POWER SUPPLY-INDEPENDENT TTL COMPATIBLE INPUT BUFFER

This application is a continuation of application Ser. No. 07/355,939, filed 05/23/89, now abandoned.

FIELD OF THE INVENTION

This invention relates to a high-speed low-power supply-independent TTL compatible CMOS input buffer.

BACKGROUND OF THE INVENTION

TTL compatible input buffers are required for many CMOS devices. In order to use such an input buffer in a variety of applications, it is desirable that the buffer be operable with different supply voltages. The use of a simple inverter circuit is not a possibility with the requirement that the input buffers be operable with different supply voltages.

Other circuits for input buffers which operate under different supply voltages are available. However, they normally require a tradeoff between speed and power consumption. Generally, the faster such a circuit operates the more power it requires. The tradeoff between speed and power consumption is worst when the buffer is operated under high voltage (e.g. 15 volts) with the input voltage swinging rather close to the desired trip voltage level. The invention described in this specification discloses a supply independent CMOS input buffer which will operate at high speed and yet requires low power.

One example of a prior art TTL compatible input buffer which is independent of supply voltage is shown in FIG. 1 attached hereto. The desired trip voltage level, which is generated by a supply independent voltage reference, is supplied to the gate of transistor M2a. This generates a corresponding current which is mirrored to transistor M1a by the current mirror M3a and M4a.

The trip voltage level is established by the voltage at the gate of transistor M2a. When the voltage supplied to the input buffer at IN is higher than the trip voltage level, node N1 will be pulled to a low voltage level. When the voltage level at IN is less than the trip voltage level, node N1 will be pulled to a high voltage level.

When the supply voltage at DVDD is at a high level (e.g. 15 volts), node N1 will pull low much faster than it will pull high. This is due to the limited current available from the current mirror M3a and M4a.

The delay in pulling node N1 to a high level can be decreased by increasing the current flow through current mirror M3a and M4a. However, increasing the current flow through the current mirror also increases the power consumption of the input buffer. Furthermore, when the input voltage is high, the quiescent current through the buffer is given by the current mirrored by M3a and M4a which results in high power dissipation when the input buffer is in a quiescent state.

SUMMARY OF THE INVENTION

In accordance with the present invention, the problem relating to the tradeoff between speed and power dissipation for a CMOS TTL compatible input buffer as discussed above is minimized. The present invention provides a CMOS input buffer which operates at high speed and yet has low overall power dissipation.

The high-speed low-power supply-independent input buffer is provided by having a current source. There is further provided a first switch device coupled between the current source and a reference node, the first switch device being responsive to the voltage level at the output node for changing from an on to an off state.

There is a circuit for supplying a trip voltage level to the input buffer, and there is also a second switch device coupled between the reference node and ground, the second switch device being responsive to the voltage level of the input node, being in first state when the voltage level is above the trip voltage level and second state when the voltage level is below the trip voltage level.

The present invention further has a current supply circuit coupled to the reference node for selectively injecting current into the reference node, the current supply circuit injecting current during a predetermined time period after the voltage level at the input node changes from a high level to a low level.

The input buffer also has an inverter coupled between the reference node and the output node for inverting the voltage level at the reference node and applying it at the output node.

There is also provided a control circuit coupled to the current supply circuit for limiting current flow from the current supply circuit into the reference node, the control circuit limiting the current flow when the voltage level at the input node is outside a predetermined range, and enabling current flow when the voltage level at the input node is within the predetermined range.

The control circuit comprises a second current source, with a third switch device coupled between the second current source and the reference node, the third switch device being responsive to the voltage level of the output node for switching from an off to an on state. A delay circuit is coupled between the third switch device and the output node for delaying the response of the third switch device to a change in voltage level at the output node.

The control circuit also includes a fourth switch device coupled between the control means and ground, the fourth switch device being in a first state when the voltage level at the input node is above the trip voltage level and in a second state when the voltage level at the input node is below the trip voltage level.

There is also presented a method of increasing the speed and decreasing the power dissipation of a CMOS TTL compatible input buffer having an input node and an output node, comprising the steps of supplying a trip voltage level to the input buffer; supplying current from a current source into a reference node of the input buffer when the voltage level at the input node exceeds the trip voltage level;

feeding back the voltage level at the output node to the current source;

turning off the current source when the output voltage exceeds a predetermined value;

injecting current into the reference node from a second current source when the voltage level at the input node falls below the predetermined trip voltage level;

inverting the signal appearing at the output node;

feeding back the inverted signal to the second current source; and turning off the second current source a predetermined time after the inverted signal falls below a predetermined voltage level.

The method further comprises the step of inverting the signal at the reference node and applying it to the output node.

The method can also include the steps of: enabling current flow from the first current source when the output node is at a low level; and enabling current flow from the second current source when the output node is at a high level.

The current supply circuit provides large amounts of current to pull the reference node to a high level. However, current through the current supply circuit is limited after the output node has transitioned to a low state. The current supply circuit thus effectively only operates during the time it takes the output node to transition from a high level to a low level.

The current source provides current to pull the reference node to a low level. Current from the current source is limited after the output node has transitioned to a high state. Thus the current from the current source is effectively supplied only during the time it takes the output node to transition from a low level to a high level.

The push-pull type operation of the current source and the current supply circuit maximizes operating speed while minimizing power dissipation.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF THE PREFERRED EMBODIMENT

Figure 2:
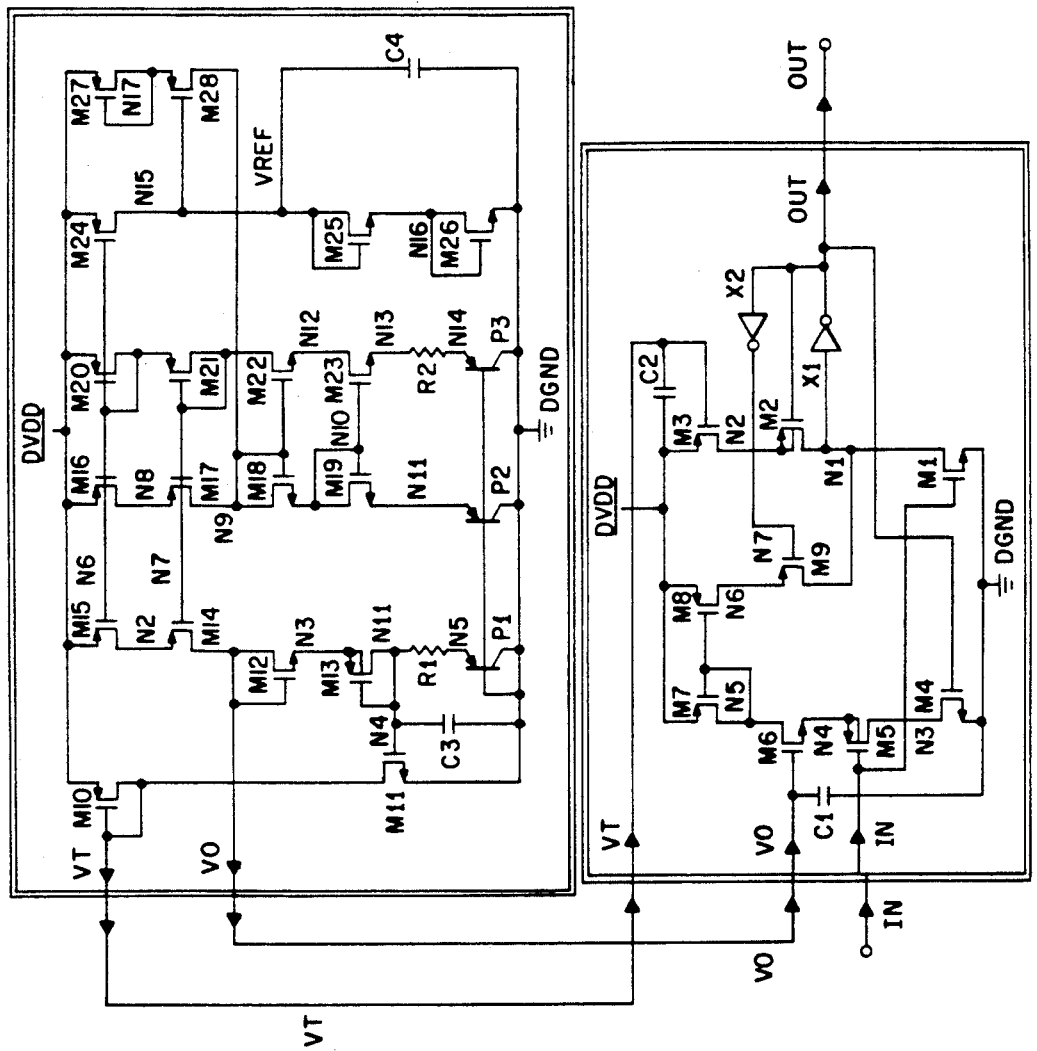
FIG. 2 illustrates the present invention.

Referring to FIG. 2, there is shown a high-speed low-power supply-independent TTL compatible CMOS input buffer in accordance with the present invention. The circuit depicted therein is preferred because it provides an input buffer which is TTL compatible, high speed, supply-independent, and requires low power.

Figure 1:
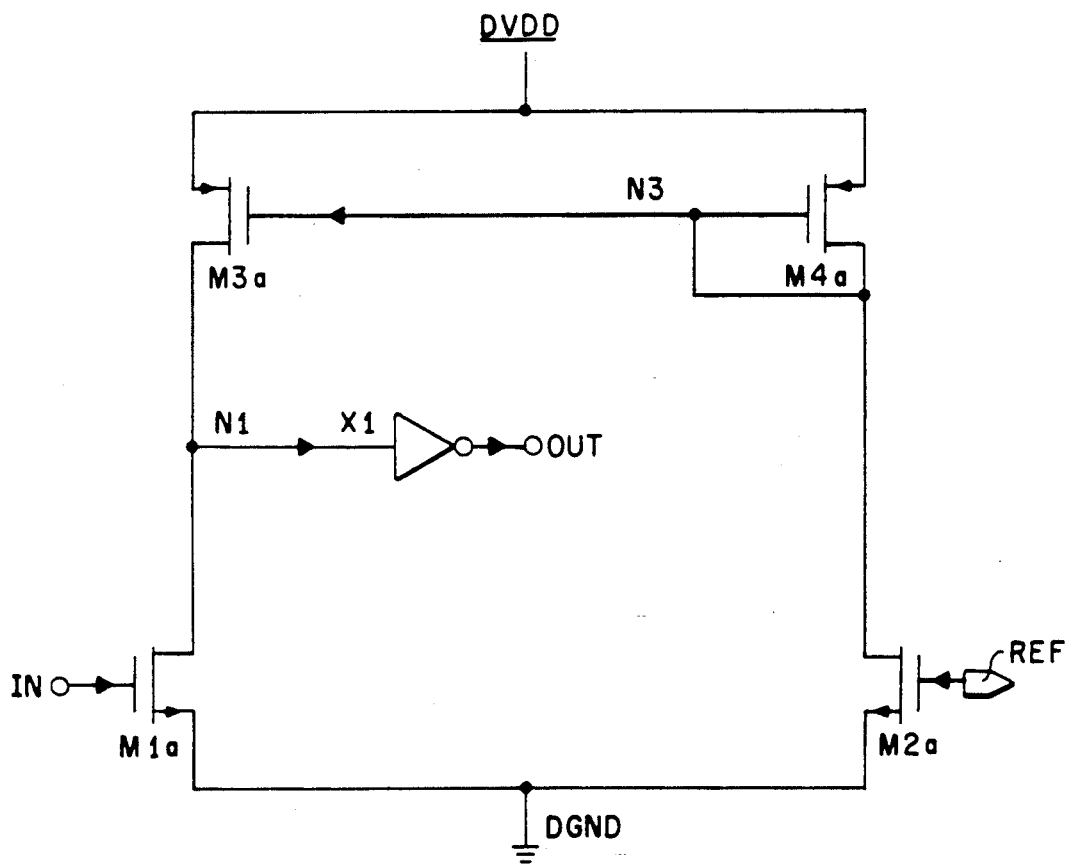
FIG. 1 illustrates a prior art input buffer.

The circuit as shown in FIG. 2 has an input node labeled IN and an output node labeled OUT. Portions of the circuit shown in FIG. 2 are similar to the prior art circuit shown in FIG. 1. Transistors M1, M3, M10 and M11 of FIG. 2 correspond roughly to transistors M1a, M3a, M4a and M2a of FIG. 1.

The circuit of FIG. 2 has a current source, which provides current to node N1. The current source is a pair of P channel MOS transistors M3 and M10 with their sources connected to supply voltage DVDD. The gates of transistors M3 and M10 are coupled together. The drain of transistor M10 is connected to its gate.

The drain of M10 is coupled to the drain of an N channel MOS transistor M11. The source of transistor M11 is coupled to ground. The gate of transistor M11 is coupled to node N4 of the block labeled VREF. A capacitor C3 is coupled between the gate of M11 and ground.

The drain of transistor M3 is coupled to the source of a P channel MOS transistor M2. A capacitor C2 is coupled between the source and gate of transistor M3. The drain of transistor M2 is coupled to reference node N1 in the block labeled TTLIN. The gate of transistor M2 is coupled to the output of inverter X1. The input of inverter X2 is coupled to the output node labeled OUT in block TTLIN.

The drain of an N channel MOS transistor M1 is also coupled to reference node N1. The source of MOS transistor M1 is coupled to ground. The gate of transistor M1 is coupled to the input node labeled IN.

The input buffer also has a second current source. The second current source consists of a current mirror comprising a pair of P channel MOS transistors M7 and M8. The sources of transistors M7 and M8 are coupled to supply voltage DVDD. The gates of transistors M7 and M8 are coupled together, with the gate of transistor M7 being coupled to its drain.

The drain of an N channel MOS transistor M6 is coupled to the drain of transistor M7. The gate of MOS transistor M6 is coupled to a bias voltage source labeled VO in FIG. 2 and to ground through capacitor C1. The source of transistor M6 is connected to the source of a P channel MOS transistor M5. The gate of transistor M5 is coupled to the input node IN.

The drain of an N channel MOS transistor M4 is coupled to the drain of transistor M5. The source of transistor M4 is coupled to ground, with the gate of transistor M4 being coupled to the output node OUT.

The bias voltage at VO is provided by a pair of transistors M12 and M13. M13 is a P channel MOS transistor having its gate and drain connected to node N4, which is the node providing the trip level voltage to the input buffer through transistor M11. The source of transistor M13 is coupled to the source of an N channel MOS transistor M12. The gate and drain of transistor M12 are coupled to the gate of transistor of M6, as well as to the drain of transistor M14. Transistor M14 is a portion of the circuitry labeled VREF in FIG. 2, which provides the trip level voltage at node N4.

A P channel MOS transistor M15 is coupled between the source of transistor M14 and the supply voltage.

A first pair of P channel MOS transistors M16 and M20 are coupled to the supply voltage DVDD. The gates of transistors M16 and M20 are coupled together, as well as to the gate of transistor M15. The gate of transistor M20 is coupled to its drain.

A second pair of P channel MOS transistors M17 and M21 have their respective sources connected to the drains of transistors M16 and M20 respectively. The gates of transistors M17 and M21 are coupled together, as well as to the gate of M14.

A first pair of N channel MOS transistors M18 and M22 have their drains connected to the drains of transistors M17 and M21, respectively. The gates of transistors M18 and M22 are coupled together and to the drain of M18.

A second pair of N channel MOS transistors M19 and M23 have their drains coupled to the sources of transistors M18 and M22, respectively. The gates of transistors M19 and M23 are coupled together. The gate of M19 is also coupled to its drain. The source of transistor M19 is coupled to the emitter of a PNP transistor P2. The collector of PNP transistor P2 is coupled to ground. The source of transistor M23 is coupled to the emitter of a PNP transistor P3 through resistor R2. The collector of transistor P3 is also coupled to ground. The bases of transistor P2 and P3 are coupled together, as well as to the base of a third PNP transistor P1. The collector and base of PNP transistor P1 are coupled to ground. The emitter of transistor P1 is coupled to the drain of transistor M13 through a resistor R1. A capacitor C2 is coupled between the gate of transistor M11 and ground.

VREF also has a P channel MOS transistor M24 with its source connected to the supply voltage, and its gate coupled to the gates of transistors M15, M16 and M20. The drain of transistor M24 is coupled to the gate and drain of an N channel MOS transistor M25.

The source of transistor M25 is coupled to the gate and drain of an N channel transistor M26, which has its source coupled to ground. A capacitor C1 is coupled between the drain of transistor M25 and ground.

A P channel transistor M27 has its source connected to the supply voltage. Its gate is coupled to its drain, which are coupled to the source of a P channel MOS transistor M28. The gate of transistor M28 is coupled to the drain of transistor M24. The drain of transistor M28 is coupled to the drains of transistors M17 and M18 as well as to the gates of transistors M18 and M22.

With the circuit shown in the block labeled VREF of FIG. 2, the trip voltage level appearing at node N4 (the gate of transistor M11) is approximately 1.6 v, which is halfway between a TTL low or off level of 0.8 v and a high or on level of 2.4 v.

The bias voltage appearing at VO (gate of transistor M6) is approximately 5 v, or the trip voltage levelof 1.6 v plus the voltage drops across diode connected transistors M12 and M13.

The trip voltage level at node N4 will remain substantially constant even though the supply voltage DVDD changes.

The circuit labeled TTLIN in FIG. 2 has two quiescent states—in the first state IN and OUT are both low, in the second state IN and OUT are both high. It also has two transition states—the first when IN goes from a low level to a high level (with OUT correspondingly going from low to high), and the second when IN goes from a high level to a low level (with OUT correspondingly going from high to low).

When the voltage at the input node and the output node of the input buffer is at a low level (IN below 1.6 volts), transistors M4 and M9 are turned off, while transistor M2 is on. With transistor M2 turned on, current through current mirror M3 and M10 is enabled. If the input voltage is less than the threshold voltage ($V_T$) of M1, M1 will be off. If the input voltage is greater than $V_T$ but less than the trip voltage level, M1 will be in a first conductive state, but current into reference node N1 will be limited by M1. If the input voltage is greater than the trip voltage level, M1 will be in a second conductive state, capable of sourcing more current than is supplied by current mirror M3 and M10. In this state, current into reference node N1 is limited by current mirror M3 and M10, not by M1.

Since transistor M9 is off, no current is flowing into reference node N1 through ratioed current mirror M7, M8. Since transistor M4 is also off, no current will flow through M4, M5 and M6.

When the voltage level at the input node goes high and exceeds the trip voltage level, transistor M1 is turned hard on which pulls node N1 low rapidly. The more the input voltage level exceeds the trip voltage level, the more rapidly node N1 will be pulled low. As node N1 is pulled low, the output node will go high, because of inverter X1, which will turn off transistor M2. At the same time, transistors M4 and M9 are turned on. With transistor M2 turned off, there will be no current flow through current mirror M3, M10 into node N1, which reduces power dissipation.

Even though transistors M4 and M9 are turned on when the output node is high, current through current mirror M7, M8 into node N1 is limited because transistors M5 and M6 are turned off. M5 and M6 can easily be turned completely off since the voltage VO supplied to the gate of transistor M6 (which in this case is approximately 5 volts) can be considerably less than supply voltage DVDD.

When the input node goes low and drops below the trip voltage level, transistors M5 and M6 are turned on. The ratioed current mirror M7, M8 causes a large amount of current to flow into node N1, causing it to pull high very rapidly. As node N1 pulls high, the output node will go low because of inverter X1. After a short delay, caused by inverter X2, transistor M9 turns off. The slight delay before transistor M9 is turned off provided by inverter X2 allows the large amounts of current flowing through current mirror M7, M8 to flow into node N1 so that it is pulled high very rapidly. When M9 turns off, current flow into node N1 through M8 ceases, reducing power dissipation.

With the input buffer in a quiescent state, either with the input and output both low, or the input and output both high, the current drawn by the block labeled TTLIN is practically zero. With the output high and the input buffer in its quiescent state, transistor M2 disables current flow from the current mirror M3, M10 into node N1, while the combined actions of transistors M5 and M6 disable current flow from current mirror M7, M8 into node N1. When the input voltage of the circuit shown is maintained at less than or equal to 0.5 v or greater than or equal to 4.5 v, TTLIN draws practically no current.

With the circuit as shown in FIG. 2, it is possible to include the circuit components contained within the block labeled VREF on one area of a chip, and to include the circuit components shown in the block labeled TTLIN on other areas of the chip. This makes it possible to use a single voltage reference supply VREF to supply the required voltage references to many input buffers. This keeps the total standby current quite low.

Capacitors C1 and C2 in block TTLIN are provided for de-coupling when many input buffers TTLIN are supplied by the same VREF. It can be seen that there has thus been provided a high-speed low-power supply-independent CMOS TTL compatible input buffer. This has been achieved by providing sources of current to pull the output node low or high which are in operation only during the period in which the voltages are transitioning from low to high or high to low, and which draw virtually no power during the quiescent states of the input buffer.

Although the invention has been described with respect to a specific preferred embodiment thereof, many variations and modifications will become apparent to those skilled in the art. It is therefore the intention that the appended claims be interpreted as broadly as possible in view of the prior art to include all such variations and modifications.

We claim:

1. A CMOS TTL compatible input buffer having an input node and an output node, comprising:
   a current source;
   a first switch device coupled between the current source and a reference node, the first switch device being responsive to the voltage level of the output node for changing from a first to a second state, said output node being responsive to the voltage at said reference node;

a circuit connected to the current source for supplying a trip voltage level to the current source;

a second switch device coupled between the reference node and ground, the second switch device being responsive to the voltage level of the input node, being in a first state when the voltage level is above the trip voltage level and a second state when the voltage level is below the trip voltage level;

a current supply circuit coupled to the reference node for selectively injecting current into the reference node, the current supply circuit injecting current during a predetermined time period after the voltage level at the input node changes from a high level to a low level; and a control circuit coupled to the current supply circuit for limiting current flow from the current supply circuit into the reference node, the control circuit limiting the current flow when the voltage level at the input node is outside a predetermined range and enabling current flow when the voltage level at the input node is inside the predetermined voltage range.

2. The input buffer of claim 1, further comprising;
an inverter coupled between the reference node and the output node for inverting the voltage level at the reference node and applying it to the output node.

3. The input buffer of claim 1, wherein the current supply circuit comprises:
a second current source;
a third switch device coupled between the second current source and the reference node, the third switch device being responsive to the voltage level of the output node for switching from a first to a second state; and
a delay circuit coupled between the third switch device and the output node for delaying the response of the third switch device to a change in the voltage level at the output node.

4. The input buffer of claim 1, wherein the control circuit comprises:
a switching circuit coupled to the current supply circuit for enabling current flow from the current supply circuit when the voltage at the input node is within a predetermined voltage range, and limiting current flow when the voltage level at the input node is outside the predetermined voltage range; and
a third switch device coupled between the switching circuit and ground, the third switch device being in a first state when the voltage level at the input node is above the trip voltage level and in a second state when the voltage level at the input node is below the trip voltage level.

5. The input buffer of claim 3, wherein the delay circuit comprises an inverter coupled between the output node and the third switch device.

6. The input buffer of claim 3, wherein the second current source comprises a current mirror.

7. The input buffer of claim 1, wherein the current source comprises a current mirror.

8. A CMOS TTL compatible input buffer having an input node and an output node, comprising:
a first current source;
a first switch device connected between the current source and a reference node, the first switch means being responsive to the voltage level of the output node for changing from an on to an off state, the output node being responsive to the voltage at the reference node;
a circuit connected to the first current source for applying a trip voltage level to the first current source;
a second switch device connected between the reference node and ground, the second switch device being responsive to the voltage level of the input node, being in a first state when the voltage level of the input node is above the trip voltage level, and being in a second state when the voltage level at the input node is below the trip voltage level,
a second current source;
a third switch device connected between the second current source and the reference node for conducting current from the second current source into the reference node, the third switch device being responsive to an input signal to switch to an on state;
a delay circuit connected between the output node and the third switch device for transmission of the input signal being a delayed signal from the output node to the third switch device;
a control circuit coupled to the second current source for enabling current flow from the second current source, the control circuit limiting current flow when the voltage at the input node is outside a predetermined range and enabling current flow when the voltage at the input node is within the predetermined range; and
a fourth switch device coupled between the control circuit and ground, the fourth switch device being in an on state when the output node is at a high level and in an off state when the output node is at a low level.

9. The input buffer of claim 8, wherein the delay circuit comprises:
an inverter, for inverting the signal appearing at the output node.

10. The input buffer of claim 8, wherein the control circuit for enabling current flow comprises;
a pair of series connected switches coupled between the second current source and the fourth switch device, the pair of switches both being in an on state only when the voltage at the input node is within the predetermined voltage range.

11. The input buffer of claim 10, further comprising:
a circuit for applying a bias voltage to one of the pair of switches.

12. A CMOS TTL compatible input buffer having an input node and an output node, comprising:
a first current mirror;
a first switch connected between the first current mirror and a reference node, the first switch having an input connected to the output node and being responsive to a signal at the input for switching from an off to an on state the output being responsive to the voltage at the reference node;
a circuit connected to the first current mirror for supplying a trip voltage level to the first current mirror;
a second switch having an input, the second switch being connected between the reference node and ground, the second switch being in a first state when the signal at its input is at a high level and being in a second state when the signal at its input is at a low level;
a second current mirror;

a third switch connected between the second current mirror and the reference node, the third switch having an input, being in an off state when the signal at its input is high, and in an on state when its input is low;

an inverter connected between the output node and the input of the third switch, the inverter inverting the signal at the output node and applying it to the input of the third switch after a predetermined time delay;

a control circuit connected to the second current mirror, the control circuit limiting current through the second current mirror when the voltage at the input node is within the predetermined range; and a fourth switch connected between the control circuit and ground, the fourth switch having an input connected to the output node, being in an on state when the output node is at a high level and an off state when the output node is at a low level.

13. the input buffer of claim 12, wherein the first current mirror comprises a pair of P-channel MOS transistors each having gates and each having a source connected to a voltage supply and a drain of one of the pair connected to the first switch, a drain of the other one of the pair to the gates of the pair and to the circuit for supplying a trip voltage.

14. The input buffer of claim 12, wherein in the circuit for supplying a trip voltage level comprises:
an N-channel MOS transistor, having its drain and source connected to the first current mirror and ground, respectively; and
a supply-independent voltage source connected to the gate of the N-channel transistor.

15. The input buffer of claim 12, wherein the second switch comprises an N-channel MOS transistor having its drain and source connected to the reference node and ground, respectively, and its gate connected to the input node.

16. The input buffer of claim 12, wherein the second current mirror comprises a pair of P-channel MOS transistors having their sources connected to a supply voltage, the drain of one of the pair being connected to the third switch, and the drain of the other one of the pair being connected to the control circuit.

17. The input buffer of claim 12, wherein the third switch comprises a P-channel MOS transistor having its source connected to the second current source and its drain connected to the reference node, with its gate connected to the inverter.

18. The input buffer of claim 12, wherein the control circuit comprises:
a first N-channel MOS transistor having its drain connected to the second current mirror; and
a P-channel MOS transistor having its source connected to the source of the first N-channel transistor and its gate connected to the input node; and
wherein the fourth switch comprises
a second N-channel MOS transistor having its drain connected to the drain of the P-channel transistor and its source connected to ground, with its gate connected to the output node.

19. The input buffer of claim 18, further comprising: a circuit for supplying a bias voltage to the gate of the first N-channel transistor.

20. The input buffer of claim 19, wherein the circuit for supplying a bias voltage comprises a P-channel MOS transistor having its gate and drain connected to circuit for supplying a the trip voltage level; and
a third N-channel MOS transistor having its source connected to the source of the P-channel transistor, with its gate and drain connected to the gate of the first N-channel transistor.

21. A method of increasing the speed and decreasing the power dissipation of a CMOS TTL compatible input buffer having an input node and an output node, comprising the steps of:
supplying a trip voltage level to the input buffer;
supplying current from a first current source into a reference node of the input buffer when the voltage level at the input node exceeds the trip voltage level;
feeding back the voltage level at the output node to the first current source;
turning off the first current source when the voltage level at the output node is at a high level; injecting current into the reference node from a second current source when the voltage level at the input node falls below the predetermined trip voltage level; and
turning off the second current source a predetermined period of time after the voltage level at the output node goes to a low level.

22. The method of claim 21, wherein the step of turning off the second current source further comprises the following steps:
inverting the signal appearing at the reference node and applying it to the output node;
feeding back the signal at the output node to the second current source; and
switching off the second current source a predetermined period of time after the signal at the output node goes to a low level.

23. The method of claim 21, wherein the step of switching off the second current source further comprises the steps of:
inverting the signal appearing at the output node;
delaying the inverted signal; and
switching off the second current source when the delayed signal is at a high level.

24. The method of claim 21, further comprising the steps of:
enabling current flow from the first current source into the reference node when the input node is at a high level; and
enabling current flow from the second current source when the input node is at a low level.

* * * * *